United States Patent
Lee et al.

(10) Patent No.: US 9,349,923 B2
(45) Date of Patent: May 24, 2016

(54) LIGHT-EMITTING DIODE PACKAGE
(71) Applicant: LG INNOTEK CO., LTD., Seoul (KR)
(72) Inventors: Sangwoo Lee, Seoul (KR); Sunghee Won, Seoul (KR)
(73) Assignee: LG INNOTEK CO., LTD., Seoul (KR)
( * ) Notice: Subject to any disclaimer, the term of this patent is extended or adjusted under 35 U.S.C. 154(b) by 0 days.
(21) Appl. No.: 14/695,144
(22) Filed: Apr. 24, 2015
(65) Prior Publication Data
US 2015/0243851 A1 Aug. 27, 2015

Related U.S. Application Data
(63) Continuation of application No. 13/420,908, filed on Mar. 15, 2012, now Pat. No. 9,029,877.

(30) Foreign Application Priority Data
Jun. 8, 2011 (KR) .................. 10-2011-0055019

(51) Int. Cl.
*H01L 25/075* (2006.01)
*H01L 33/48* (2010.01)
*H01L 33/62* (2010.01)
*H01L 27/15* (2006.01)
*H01L 33/50* (2010.01)

(52) U.S. Cl.
CPC .......... *H01L 33/483* (2013.01); *H01L 25/0753* (2013.01); *H01L 27/15* (2013.01); *H01L 33/50* (2013.01); *H01L 33/62* (2013.01); *H01L 33/486* (2013.01); *H01L 2924/0002* (2013.01)

(58) Field of Classification Search
CPC ................. H01L 2224/48465; H01L 2224/81; H01L 33/486; H01L 33/62; H01L 23/49833; H01L 2924/12041; H01L 33/60; H01L 33/54
See application file for complete search history.

(56) References Cited

U.S. PATENT DOCUMENTS

| | | | | |
|---|---|---|---|---|
| 8,183,583 B2 * | 5/2012 | Jung | ................... | H01L 25/0753 257/88 |
| 8,269,243 B2 * | 9/2012 | Duan | ....................... | F21V 5/04 257/100 |
| 8,278,671 B2 * | 10/2012 | Jung | .................... | H01L 25/0753 257/88 |
| 8,618,558 B2 * | 12/2013 | Kong | .................... | H01L 33/486 257/79 |
| 2008/0123021 A1 * | 5/2008 | Park | ..................... | H01L 25/075 349/67 |
| 2010/0090231 A1 * | 4/2010 | Jung | .................... | H01L 25/0753 257/89 |
| 2010/0096644 A1 * | 4/2010 | Kong | .................... | H01L 33/486 257/88 |
| 2010/0163919 A1 | 7/2010 | Kamamori et al. | | |
| 2011/0127553 A1 * | 6/2011 | Duan | ....................... | F21V 5/04 257/98 |
| 2012/0001538 A1 * | 1/2012 | Kim | ....................... | F21K 9/137 313/512 |
| 2013/0092965 A1 * | 4/2013 | Kijima | .................... | F21K 9/56 257/98 |

FOREIGN PATENT DOCUMENTS

| | | |
|---|---|---|
| CN | 101232007 A | 7/2008 |
| CN | 101969093 A | 2/2011 |
| EP | 2 337 072 | 6/2011 |
| JP | H04 150085 | 5/1992 |
| JP | 2002 329893 | 11/2002 |

OTHER PUBLICATIONS

European Search Report issued in related Application No. 12159844.5 dated Feb. 28, 2014.
U.S. Office Action issued in co-pending U.S. Appl. No. 13/420,908 dated Feb. 25, 2014.
U.S. Office Action issued in co-pending U.S. Appl. No. 13/420,908 dated Sep. 3, 2014.
U.S. Notice of Allowance issued in co-pending U.S. Appl. No. 13/420,908 dated Jan. 12, 2015.
Chinese Office Action dated Dec. 28, 2015 issued in Application No. 201210107295.3 (English Translation attached).
(Continued)

*Primary Examiner* — Jaehwan Oh
(74) *Attorney, Agent, or Firm* — Ked & Associates, LLP

(57) ABSTRACT

Disclosed is a light-emitting diode package according to an embodiment, including; a body having a cavity formed therein, a lead frame placed in the cavity; and a light emitting diode electrically connected to the lead frame while having a slope angle relative to the bottom surface of the cavity, wherein a light emitting part and a non-light emitting part are present on the light emitting diode, and wherein a connection part is provided in a region of the cavity to be connected to at least a region of the non-light emitting part.

14 Claims, 10 Drawing Sheets

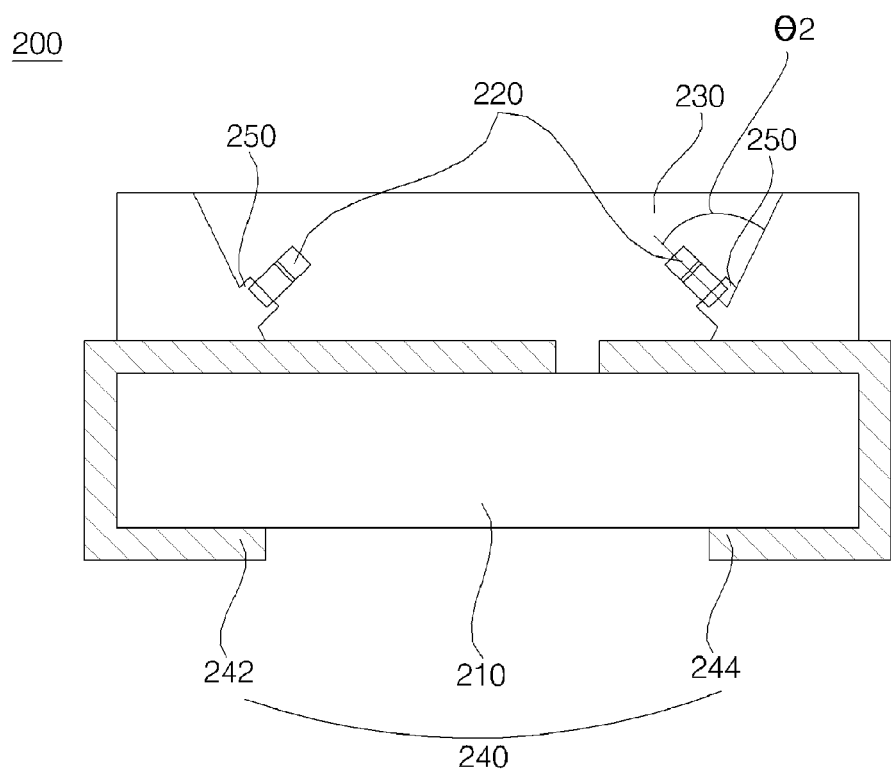

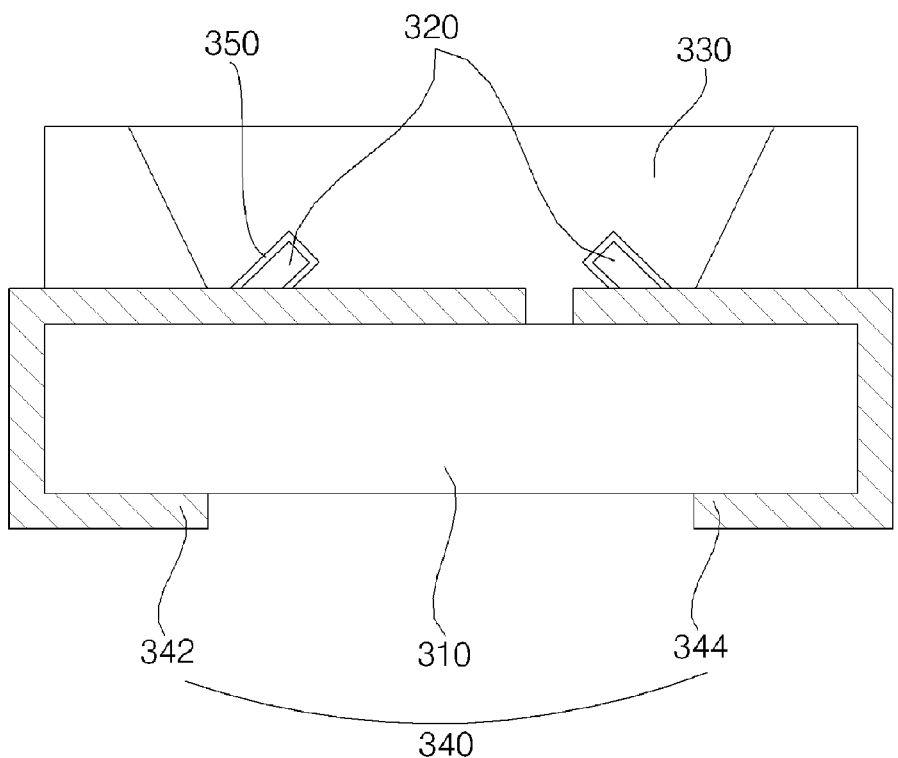

LIGHT-EMITTING DIODE PACKAGE

CROSS-REFERENCE TO RELATED APPLICATION

This application is a Continuation of co-pending application Ser. No. 13/420,908, filed on Mar. 15, 2012, which claims the priority benefit of Korean Patent Application No. 10-2011-0055019, filed on Jun. 8, 2011 in the Korea Intellectual Property Office, the disclosures of which are incorporated herein by reference.

BACKGROUND

1. Field

Embodiments relate to a light-emitting diode package.

2. Description of the Related Art

A light-emitting diode (LED) is a device which converts electricity into light using characteristics of compound semiconductors. LEDs are now being applied to devices such as home appliances, remote controls, electronic signboards, displays, a variety of automatic appliances and the like and their application range continues to expand.

A light-emitting diode generally dissipates energy, in particular, in heat or light form corresponding to an energy gap between a conduction band and a valence band through combination of electrons in an n-layer and holes in a p-layer by applying forward voltage. Here, a device emitting the energy in light form is substantially an LED.

A nitride semiconductor generally has high thermal stability and wide band-gap energy and, thus, attracts great interest in development of light elements and high output electronic elements. Specifically, blue, green and/or UV light-emitting devices using nitride semiconductors are commercially available in a broad range of applications.

A light-emitting diode (hereinafter 'LED') package may be fabricated by preparing an LED on a substrate, separating an LED chip through die-separation as a sawing process, diebonding the LED chip to a package body, and wire bonding and molding, followed by testing the same.

The preparation of the LED chip and the packaging thereof proceed independently, in turn causing problems of requiring complex processes and/or several substrates.

SUMMARY

Therefore, embodiments disclosed herein provide an LED package having an LED with a desired slope angle relative to the bottom surface of a cavity on the package to reflect light irradiated through a lateral side of the LED, thus maximizing light extraction.

According to an embodiment, there is provided an LED package, including: a body having a cavity formed therein; a lead frame placed in the cavity; and an LED electrically connected to the lead frame, having a slope (that is, sloped) relative to the bottom surface of the cavity and including a light emitting part and a non-light emitting part are present in the LED, and wherein a connection part is provided in a region of the cavity to be connected to at least a region of the non-light emitting part.

BRIEF DESCRIPTION OF THE DRAWINGS

The above and other objects, features and other advantages of the embodiments disclosed herein will be more clearly understood from the following detailed description taken in conjunction with the accompanying drawings, in which:

FIG. 2A is a cross-sectional view illustrating a cross-section of an LED package according to an embodiment;

FIG. 3 is a cross-sectional view illustrating an LED package according to an embodiment;

DETAILED DESCRIPTION OF THE PREFERRED EMBODIMENTS

Figure 1A:
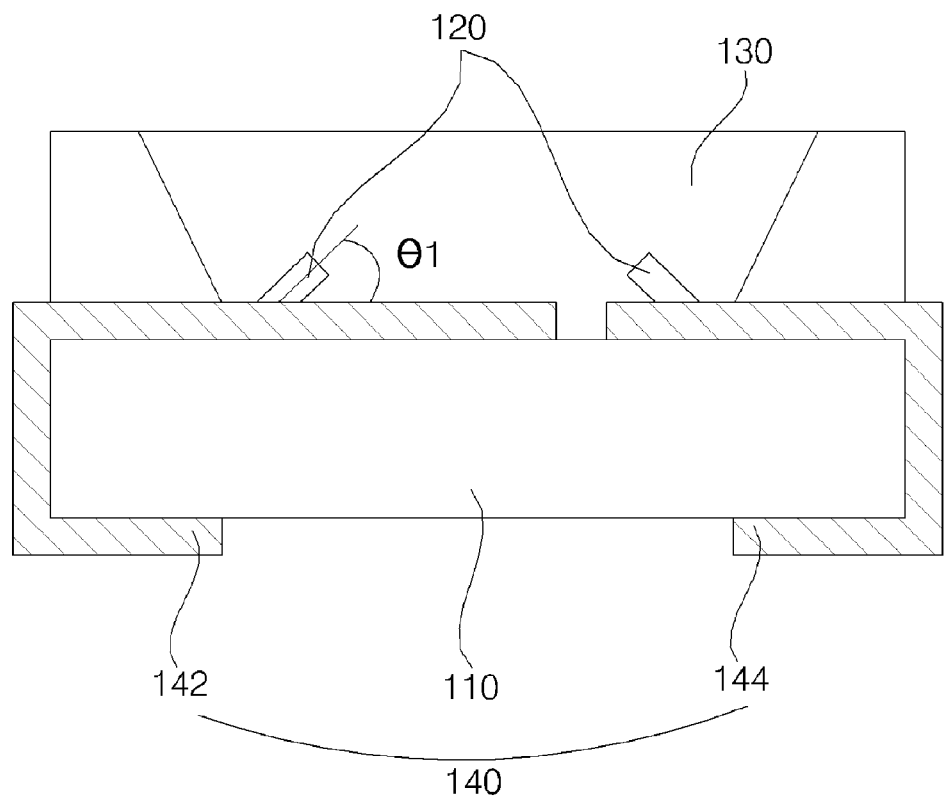
FIG. 1A is a cross-sectional view illustrating a cross-section of an LED package according to an embodiment.

Prior to description of the embodiments, it will be understood that when an element such as a layer (film), region, pattern, or structure is referred to as being formed "on" or "under" another element, such as a substrate, layer (film), region, pad, or pattern, it can be directly "on" or "under" the other element or be indirectly formed with intervening elements therebetween. Further, "on" or "under" of each layer will be described based on illustration in the drawings.

In the drawings, thicknesses and/or sizes of respective layers may be enlarged, omitted or schematically illustrated for convenience of explanation or clarity. In addition, sizes of respective elements may not entirely reflect the real size thereof. Further, the same reference numbers will be used throughout the drawings to refer to the same or like parts.

Hereinafter, the present invention will be described in more detail with reference to the annexed drawings.

Figure 1B:
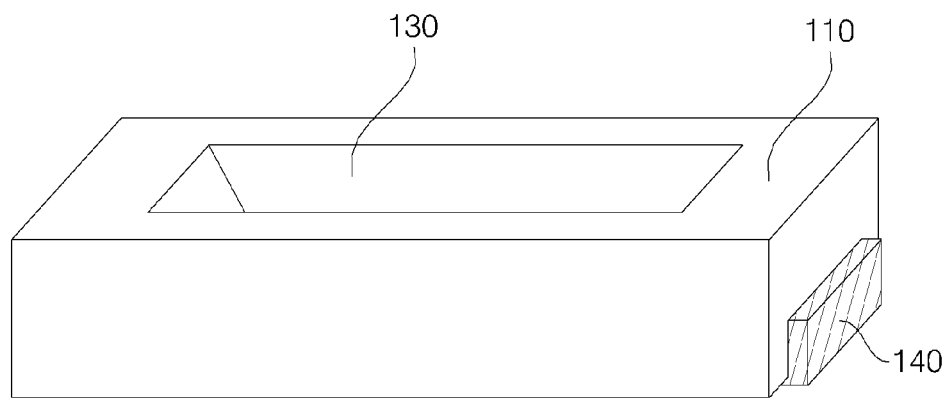
FIG. 1B is a perspective view illustrating an LED package according to an embodiment.

FIG. 1A is a cross-sectional view illustrating an Light Emitting Device ('LED') package 100 according to an embodiment; and FIG. 1B is a perspective view illustrating the LED package 100 according to an embodiment.

Referring to FIGS. 1A and 1B, the LED package 100 according to the embodiment may include: a body 110 having a cavity 130; a lead frame 140 disposed in the cavity 130; and an Light Emitting Device('LED') 120 electrically connected to the lead frame, having a slope angle relative to the bottom surface of the cavity 130 and including a light emitting part and a non-light emitting part, wherein a connection part (not shown) is provided in a region of the cavity to be connected to at least one region of the non-light emitting part.

The body 110 may be formed using at least one selected from polyphthalamide (PPA) as a resin material, silicon (Si), aluminum (Al), aluminum nitride (AlN), a liquid polymer (photosensitive glass; PSG), polyamide 9T (PA9T), syndiotactic polystyrene (SPS), metal materials, sapphire ($Al_2O_3$), beryllium oxide (BeO), a printed circuit board (PCB), or the like. The body 110 may be formed by injection molding, etching, etc., without being particularly limited thereto.

The body 110 may have a sloped part on the side surface formed by the recession of a top surface of the body. Depending upon an angle of the sloped surface, a reflection angle of light emitted from the LED 120 may be varied and, in addition, an orientation angle of the light may be controlled.

The cavity 130 may be formed by recessing the body 110. The cavity 130 is preferably formed by forming a recession in a top surface of the body 110. The cavity 130 may be processed to expose a part of the lead frame 140 by forming a recession in the body 110. Alternatively, the LED 120 is disposed in the cavity 130 to dissipate light emitted from the LED to the outside.

When viewing the cavity 130 from the top side, it may have various shapes including a circular shape, a rectangular shape, a polygonal shape, an elliptical shape, specifically, and a shape with curved corners, without being particularly limited thereto.

The cavity 130 may be coated with a material having high reflectivity at an side surface and bottom surface thereof. Alternatively, the cavity 130 may have an side surface and bottom surface made of a material having high reflectivity to reflect light, without being particularly limited thereto.

The reflective layer (not shown) may be provided on the side surface and/or bottom surface. The reflective layer (not shown) may be formed using a specific material such as silver (Ag), without being particularly limited thereto. The reflective layer (not shown) may reflect light emitted from the LED 120 and dissipate the same outside the LED package 100.

The cavity 130 may reflect light emitted from the LED 120. The cavity 130 may reflect light emitted from the LED 120 and dissipate the same toward the top of the package 100. Alternatively, the cavity 130 may reflect light emitted from the LED 120 and enabling formation of a desired orientation angle.

The cavity 130 may be provided with the LED 120 at the side surface thereof. The cavity 130 may have the lead frame positioned on the bottom surface thereof. The cavity 130 may have the LED 120 perpendicular to the side surface thereof. Alternatively, the cavity 130 may maximize use of side light of the LED 120.

On a region of the cavity 130, a connection part (not shown) having the LED 120 may be provided. The cavity 130 may be provided with the connection part (not shown) at the side surface of the cavity. Alternatively, the cavity 130 may be provided with the LED 120 via the connection part (not shown).

The connection part (not shown) may be formed in a region of the cavity 130. The connection part (not shown) may be formed on the side or bottom surface of the cavity 130. The connection part (not shown) may be formed perpendicular to the side surface of the cavity 130. Alternatively, the connection part (not shown) may be formed by protruding or recessing a region of the cavity 130.

The connection part (not shown) may be connected to the LED 120. The connection part (not shown) may be combined with a part at one side of the LED 120. The connection part (not shown) may be combined with a part of the substrate (not shown) to maximize side light emission.

The connection part (not shown) may be coupled with a non-light emitting part (not shown) of the LED 120.

The connection part (not shown) may be provided with the substrate of the LED 120 to minimize light shielding. The connection part (not shown) may absorb heat emitted by the LED 120. The connection part (not shown) may contribute to improvement of thermal protection performance of the LED package 100.

The lead frame 140 may be provided on the body 110. The lead frame 140 may include first and second electrodes 142 and 144. The first and second electrodes 142 and 144 are electrically connected to the LED 120 to supply power to the LED 120.

The first and second electrodes 142 and 144 may be electrically isolated from each other. The first and second electrodes 142 and 144 may reflect light emitted from the LED 120 to improve luminous efficacy. Alternatively, the first and second electrodes 140 and 150 may dissipate heat generated by the LED 120.

Each of the first and second electrodes 142 and 144 may comprise at least one metallic substance selected from titanium (Ti), copper (Cu), nickel (Ni), gold (Au), chromium (Cr), tantalum (Ta), platinum (Pt), tin (Sn), silver (Ag), phosphorous (P), aluminum (Al), indium (In), palladium (Pd), cobalt (Co), silicon (Si), germanium (Ge), hafnium (Hf), ruthenium (Ru), iron (Fe), or alloys thereof. The first and second electrodes 142 and 144, respectively, may be formed in a single layer or multi-layer structure, without being particularly limited thereto.

The LED 120 may be disposed on the lead frame 140 or connected to the lead frame 140, without being particularly limited thereto. The LED 120 may be provided to have a predetermined slope angle relative to the bottom surface of the cavity 130.

The LED package 110 may be provided with two LEDs and the two LEDs 120 may face each other.

Such LEDs 120 may have the same slope angle relative to the bottom surface of the cavity 130. Since two LEDs have the same slope angle relative to the bottom surface of the cavity 130, light emitted from the LED package 100 may have a predetermined orientation angle.

The LED 120 may be disposed inside the cavity 130. Alternatively, the LED 120 may be disposed on the bottom surface of the cavity 130.

The LED 120 may emit light. The LED 120 may irradiate light to the cavity 130. The LED 120 may dissipate light in every direction (i.e., left and right as well as forward and backward), without being particularly limited thereto. The LED 120 may irradiate light to the lateral side or bottom surface of the cavity 130. Alternatively, the LED 120 may reflect light to the cavity 130 and the lead frame 140, which in turn emits the light toward the top surface of the LED package 100.

The LED 120 may have a slope angle $\theta_1$ relative to the bottom surface of the cavity 130. Since the LED has such a slope angle θ1, side light emission may be maximally utilized. The LED 120 may dissipate light from the lateral side, enabling light irradiation to the top surface of the lead frame 140. For example, the LED 120 may have a slope angle θ1 of 45°, however, the slope angle is not particularly limited to the foregoing.

The LED 120 may be connected to the lead frame 140. The LED 120 as well as the first and second electrodes 142 and 144, respectively, may be electrically connected by any one of wire bonding, flip chip or die bonding.

The light emitting device 320 as well as the first and second electrodes 340 and 350 may be electrically connected by any one of wire bonding, flip chip, or die bonding.

The LED 120 may be mounted on the lead frame 140, and may be a device emitting light, for example, red, green, blue and/or white light, or an ultra violet LED, without being particularly limited thereto.

The LED 120 may be any one of a horizontal type device having electrical terminals aligned only on the top surface thereof, a vertical type device having electrical terminals provided on top and bottom surfaces thereof, or a flip-chip.

The LED 120 may include a first semiconductor layer (not shown), an active layer (not shown) and a second semiconductor layer (not shown), wherein the active layer is interposed between the first semiconductor layer (not shown) and the second semiconductor layer (not shown).

At least one of the first semiconductor layer (not shown) and the second semiconductor layer (not shown) may be realized as a p-type semiconductor layer doped with a p-type dopant while the other one may be embodied as an n-type semiconductor layer doped with an n-type dopant, and vice versa.

The p-type semiconductor layer may be selected from semiconductor materials having the formula of $In_xAl_yGa_{1-x-y}N$ ($0 \leq x \leq 1$, $0 \leq y \leq 1$, $0 \leq x+y \leq 1$) such as gallium nitride (GaN), aluminum nitride (AlN), aluminum gallium nitride (AlGaN), indium gallium nitride (InGaN), indium nitride (InN), InAlGaN and AlInN and may be doped with a p-type dopant such as magnesium (Mg), zinc (Zn), calcium (Ca), strontium (Sr) or barium (Ba).

The n-type semiconductor layer may be selected from semiconductor materials represented by the formula of $In_xAl_yGa_{1-x-y}N$ ($0 \leq x \leq 1$, $0 \leq y \leq 1$, $0 \leq x+y \leq 1$), for example, a group consisting of gallium nitride (GaN), aluminum nitride (AlN), aluminum gallium nitride (AlGaN), indium gallium nitride (InGaN), indium nitride (InN), indium gallium nitride (InAlGaN), aluminum indium nitride (AlInN), etc., and may be doped with n-type dopants such as silicon (Si), germanium (Ge), tin (Sn), selenium (Se), tellurium (Te), etc.

An active layer may be interposed between the first semiconductor layer (not shown) and the second semiconductor layer (not shown). The active layer may have a single or multi-quantum well structure, a quantum-wire structure or a quantum dot structure or the like, using group III-V compound semiconductor materials.

In the case where the active layer (not shown) has a quantum well structure, for example, it may have a single or multi-quantum well structure including a well layer having the formula of $In_xAl_yGa_{1-x-y}N$ ($0 \leq x \leq 1$, $0 \leq y \leq 1$, $0 \leq x+y \leq 1$) and a barrier layer having the formula of $In_aAl_bGa_{1-a-b}N$ ($0 \leq a \leq 1$, $0 \leq b \leq 1$, $0 \leq a+b \leq 1$). The well layer may be formed of a material having a smaller band gap than the barrier layer.

A conductive clad layer (not shown) may be arranged on and/or under the active layer (not shown). The conductive clad layer (not shown) may be formed of an AlGaN-based semiconductor and may have a greater band gap than the active layer (not shown).

The LED 120 may be provided in a region of the cavity 130. A filler may be provided between the LED 120 and the cavity 130.

The LED 120 may include a light emitting part and a non-light emitting part. The light emitting part is a part generating light while the non-light emitting part may be the other part except the light emitting part.

For example, the light emitting part may include the first semiconductor layer (not shown), the active layer (not shown) and the second semiconductor layer (not shown). The non-light emitting part may support the light emitting part. For instance, in a horizontal LED having horizontally arranged electrodes, the non-light emitting part may include at least one of a substrate and a buffer layer. On the other hand, for a vertical LED having vertically arranged electrodes, the non-light emitting part may include at least one of a substrate and an electrode layer, which are located on the lower portion of the light emitting part.

The light emitting part (not shown) may be positioned higher than the bottom surface of the cavity 130. The light emitting part (not shown) may maximize side light emission.

The substrate (not shown) may be prepared using semiconductor substances according to an embodiment and, for example, may be realized using a carrier wafer such as silicon (Si), germanium (Ge), gallium arsenide (GaAs), zinc oxide (ZnO), silicon carbide (SiC), silicon germanium (SiGe), gallium nitride (GaN), gallium oxide ($Ga_2O_3$), etc.

The substrate (not shown) may be prepared using conductive materials according to an embodiment. In addition, according to an embodiment, the substrate (not shown) may be prepared using metals, for example, at least one selected from gold (Au), nickel (Ni), tungsten (W), molybdenum (Mo), copper (Cu), aluminum (Al), tantalum (Ta), silver (Ag), platinum (Pt) and chromium (Cr) or alloys comprising a combination of two or more thereof and, in addition, by laminating two or more different materials. In a horizontal LED, a buffer layer (not shown) possibly included in the non-light emitting part may be located between the substrate (not shown) and the first semiconductor layer (not shown). The buffer layer (not shown) may be formed using at least one material selected among gallium nitride (GaN), indium nitride (InN), aluminum nitride (AlN), aluminum indium nitride (AlInN), indium gallium nitride (InGaN), aluminum gallium nitride (AlGaN) and indium aluminum gallium nitride (InAlGaN), without particular limitation as to types thereof. Such a buffer layer (not shown) may compensate for a difference in lattice constants between the substrate (not shown) and the first semiconductor layer (not shown).

In a vertical LED, an electrode layer included in the non-light emitting part may be located between the substrate (not shown) and the first semiconductor layer (not shown). The electrode layer may be electrically connected to the first semiconductor layer. The electrode layer (not shown) may be formed using at least one conductive material, for example, a metal selected among In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or alloys thereof, and preferably formed in a single layer or multi-layer structure, without being particularly limited thereto.

A filler (not shown) may be interposed between the LED 120 and the cavity 130. The filler (not shown) may improve adhesion between the LED 120 and the cavity 130. The filler (not shown) may prevent intrusion of impurities between the LED 120 and the cavity 130. Moreover, the filler (not shown) may prevent interface debonding between the LED 120 and the cavity 130.

A sealant (not shown) may fill the cavity 130. The sealant (not shown) may include a phosphor (not shown). The sealant (not shown) may be composed of silicon, epoxy and other resin materials. The sealant (not shown) may be formed by filling the cavity 130 with a sealant, followed by UV or heat curing.

A phosphor (not shown) may be any one selected from a blue light emitting phosphor, blue-green light emitting phosphor, green light emitting phosphor, yellow-green light emitting phosphor, yellow light emitting phosphor, yellow-red light emitting phosphor, orange light emitting phosphor and red light emitting phosphor, depending upon the wavelength of light emitted by the LED 120. The phosphor (not shown) is selected, considering the wavelength of light emitted from the LED 120 to allow the LED package 100 to render white light.

The phosphor (not shown) is excited by light emitted from the LED 120 ('first light') to create light of a second wavelength range ('second light'). For instance, in the case where the LED 120 is a blue LED and the phosphor (not shown) is a yellow phosphor, the yellow phosphor is excited by blue light to emit yellow light, and blue light emitted from the blue LED and yellow light excited from the blue light are combined, the LED package 100 may emit white light.

If the LED 120 is a green LED, a magenta phosphor or a combination of blue and red phosphors may be employed.

Alternatively, when the LED 120 is a red LED, a cyan phosphor or a combination of blue and green phosphors may be employed.

Such phosphor (not shown) may be any one commonly known in the art, such as a YAG, TAG, sulfide, silicate, aluminate, nitride, carbide, nitride-silicate, borate, fluoride or phosphate based material, etc., without being particularly limited thereto.

Figure 2B:
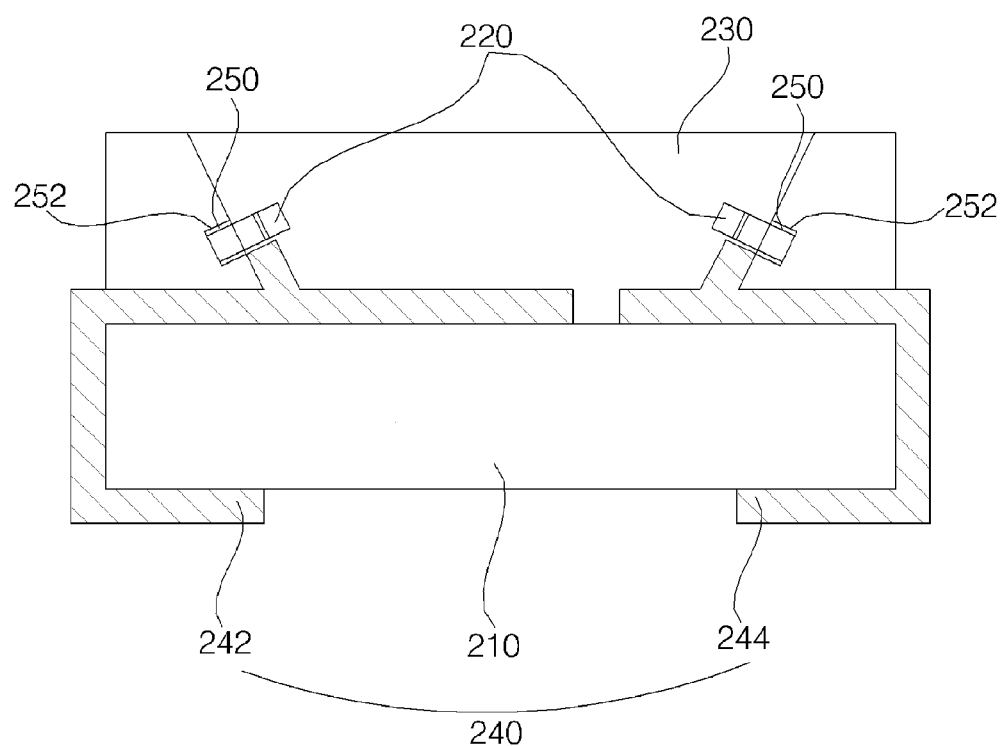
FIG. 2B is a cross-sectional view illustrating a cross-section of an LED package according to an embodiment.
Figure 2C:
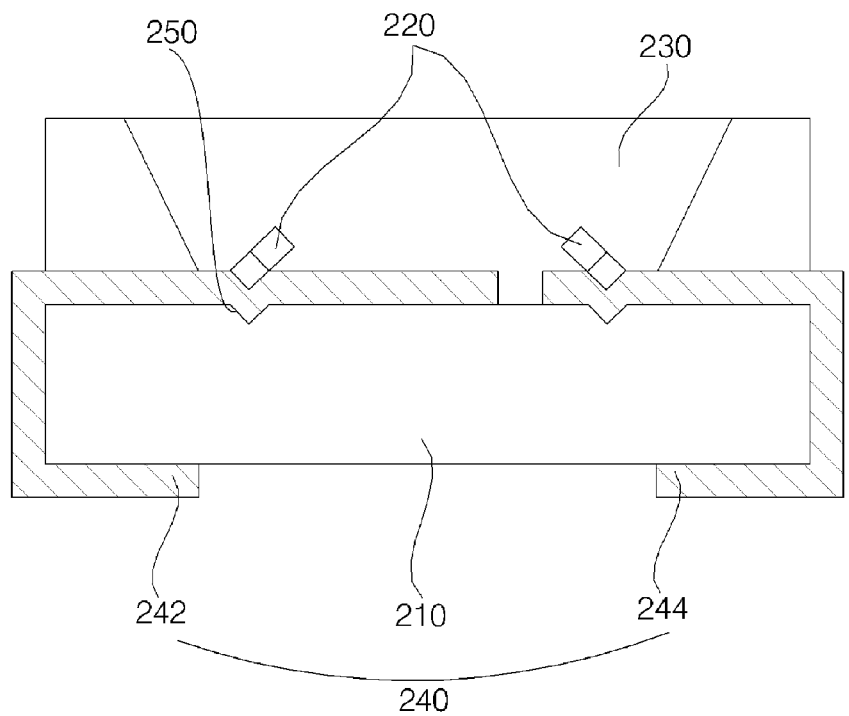
FIG. 2C is a cross-sectional view illustrating a cross-section of an LED package according to an embodiment.

FIG. 2A is a cross-sectional view illustrating a cross-section of an LED package 200 according to an embodiment; FIG. 2B is a cross-sectional view illustrating a cross-section of an LED package 200 according to another embodiment; and FIG. 2C is a cross-sectional view illustrating a cross-section of an LED package 200 according to another embodiment.

Referring to FIG. 2A, the LED package 200 according to the embodiment may include: a body 210 having a cavity 230 formed therein; a lead frame 240 provided on the body 210; an LED 220 electrically connected to the lead frame 240 while having a slope angle relative to the bottom surface of the cavity 230; and a connection part 250 carrying the LED 220 in a region of the cavity 230. The connection part 250 may carry the LED 220 because the region of the cavity 230 is protruded.

The LED 220 may be disposed inside the cavity 230. The LED 220 may be provided on an side surface of the cavity 230 to expose the lateral side of the cavity.

The LED 230 may exhibit maximum side light emission. The LED 230 may have a slope angle $\theta_2$ relative to the bottom surface of the cavity 230.

The LED package 200 may have a connection part 250 carrying the LED in a region of the cavity 230. The LED package 200 may include a connection part formed by protruding a region of the cavity 230. The LED package 200 may have a body 210 made of a resin material such as polyphthalamide (PPA) wherein PPA is protruded to form the connection part 250. The LED package 200 may have a lead frame 240 protruded into the cavity 230.

The connection part 250 may be formed by protruding a region of the side surface of the cavity 230 while enclosing the lead frame 240. The connection part 250 may be protruded into the cavity 230 to carry the LED 200. The connection part 250 may include the lead frame 240 therein to allow the LED 220 to be electrically connected to the lead frame 240.

The connection part 250 may enable the LED 220 to have a desired slope (that is, sloped) relative to the bottom surface of the cavity 230. The connection part 250 may be formed to surround a substrate (not shown) of the LED 220 so that light irradiated from the LED through a lateral side is not interrupted.

The connection part 250 may be formed such that a vertical line to a surface of the connection part 250 linked to the LED 220 is perpendicular to the side surface of the cavity 230 on which the connection part 250 is provided or, otherwise, may have a slope angle relative to the side surface of the cavity 230.

Two connection parts 250 may be provided on the body 210. More particularly, two connection parts 250 may be protruded while facing each other. Each connection part 250 may have an LED 22 and, therefore, two LEDs 220 may be provided on the LED package 200 while facing each other. The connection parts 250 may be disposed on two opposite side surfaces of the cavity 230, respectively.

The lead frame 240 may be exposed inside the cavity 230, without being particularly limited thereto. The lead frame 240 may be electrically connected to the LED 220 inside the cavity 230. Alternatively, the lead frame 240 may be coupled and linked to the connection part 250 provided on the side surface of the cavity 230, thus being connected to the LED 220.

Referring to FIG. 2B, the LED package 200 according to an embodiment may include: a body 210 having a cavity 230; a lead frame 240 provided on the body 210; an LED 220 electrically connected to the lead frame 240, and having a slope angle relative to the bottom surface of the cavity 230; and a connection part 250 to fix the LED 220 to a region of the cavity 230. The connection part 250 may be formed by recessing a region of the side surface of the cavity 230.

The LED package 200 may include the connection part 250 which carries the LED 220 in the side surface of the cavity 230. The connection part 250 of the LED package 200 may be formed by recessing a region of the cavity 230. The body 210 of the LED package 200 may be made of a resin material such as polyphthalamide (PPA), wherein PPA is recessed to form the connection part 250. The LED package 200 may include the lead frame 240 disposed in the connection part 250.

The connection part 250 may be formed by recessing a region of the cavity 230. The connection part 250 may have the lead frame 240 disposed therein. The connection part 250 may be formed by recessing a region of the cavity 230, in order to accommodate the LED 220. Moreover, the connection part 250 may have the lead frame 240 to be electrically connected to the LED 220.

The connection part 250 may be provided on each of opposite side surfaces of the cavity 230, respectively.

The connection part 250 may be formed vertically to the side surface of the cavity 230. The LED 220 in the connection part 250 may include the LED 220 which is arranged to have a desired slope angle relative to the bottom surface of the cavity 230. The connection part 250 may be formed to surround a substrate of the LED 220 so that light irradiated from the LED 220 through a lateral side is not interrupted, without being particularly limited thereto.

The lead frame 240 may be disposed inside the connection part 230. The lead frame 240 may be electrically connected to the LED 220 in the connection part 230. The lead frame 240 may be partially enclosed by the body 210. Alternatively, although a part of the lead frame 240 connected to the LED 220 is possibly exposed, no particular limitation is applied. The lead frame 240 may be extended to be nearby the connection part 250. The extended portion of the lead frame 240 may be present on the side surface of the cavity 230.

A filler 252 may be included between the connection part 250 and the LED 220. Interface debonding may occur between the connection part 250 and the LED 220. In a gap between the connection part 250 and the LED 220, a filler may be introduced to prevent interface debonding.

The connection part 250 may include the filler 252 charged in the gap between the connection part 250 and the LED 220, to thereby prevent interface debonding.

Alternatively, the filler 252 may be interposed between the connection part 250 and the LED 220. The filler 252 may improve bonding force between the connection part 250 and the LED 220.

The filler 252 may be formed using an insulating material. The filler 252 may comprise a material having adhesive properties, without being particularly limited thereto. The filler 252 may be present in a gap between the connection part 250 and the LED 220 to prevent moisture penetration. Furthermore, the filler 252 may prevent interface debonding.

Referring to FIG. 2C, the LED package may include: a body 210 having a cavity 230; a lead frame 240 provided in the cavity 230; and an LED 220 electrically connected to the lead frame 240 while having a desired slope angle relative to the bottom surface of the cavity 230, wherein the LED 220 includes a light emitting part and a non-light emitting part, and wherein a connection part 250 is formed to accommodate at least one region of the non-light emitting part on the bottom surface of the cavity 230.

The connection part 250 may be formed by depressing a region of the bottom surface of the cavity 230. The LED 220 may be provided on top of the connection part. The connection part 250 may fix the LED 220. The lead frame 240 may be disposed between the connection part 250 and the LED 220, without being particularly limited thereto.

The non-light emitting part of the LED 220 may be placed on top of the connection part 250.

FIG. 3 is a cross-sectional view illustrating a cross-section of a LED package 300 according to another embodiment.

The foregoing package may further include a wavelength conversion layer 350 arranged to enclose (or surround) the LED 320.

Figure 4A:
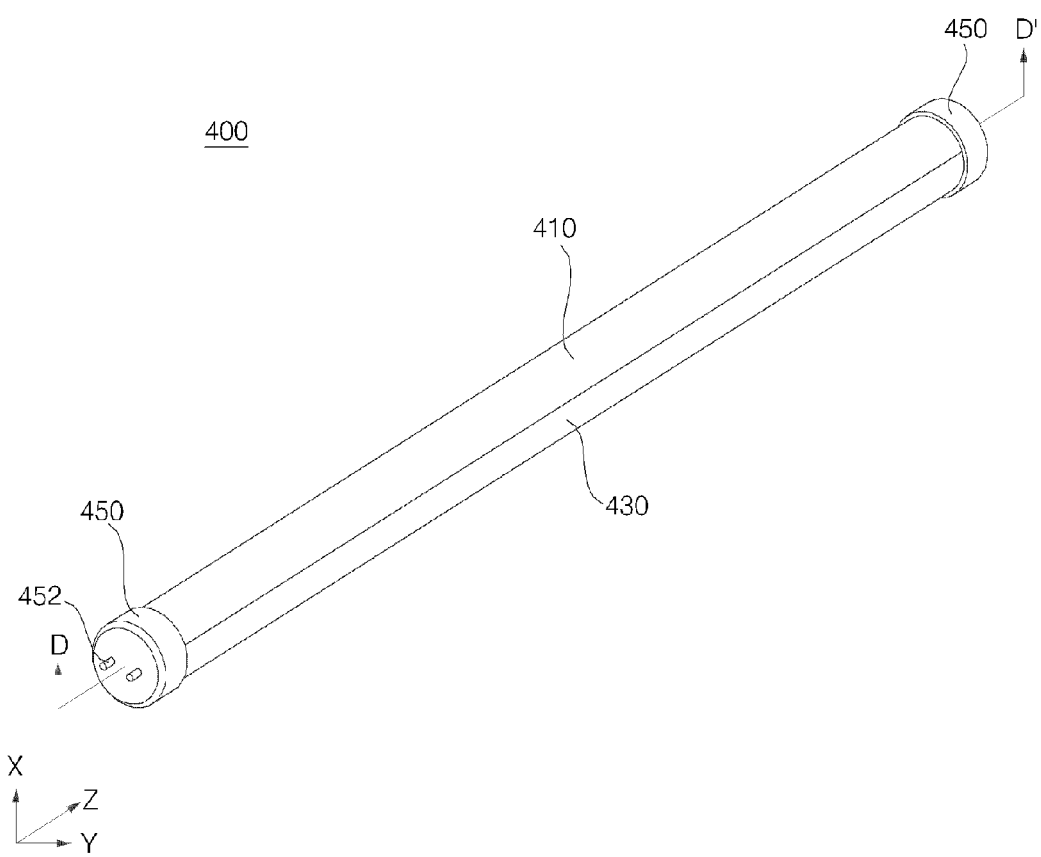
FIG. 4A is a perspective view illustrating a lighting device including an LED module according to an embodiment.

The wavelength conversion layer 350 may be provided on the surface of the LED 320. The wavelength conversion layer 350 may further include a phosphor (not shown). The wavelength conversion layer 350 has a high density phosphor (not shown), thus efficiently changing the wavelength of light emitted from the LED 320 while considerably reducing color floating. FIG. 4A is a perspective view illustrating a lighting system 400 including an LED according to an embodiment; and FIG. 4B is a cross-sectional view taken along D-D' cross-section of the lighting system shown in FIG. 4A.

Figure 4B:
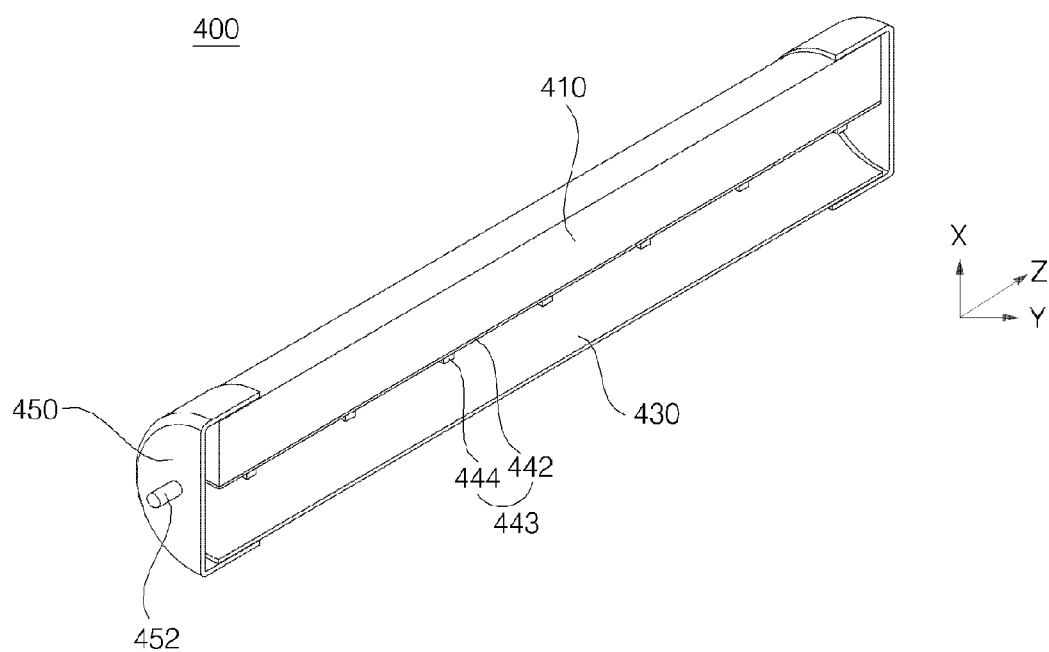
FIG. 4B is a perspective view illustrating a lighting device including an LED module according to an embodiment.

That is, FIG. 4B is a cross-sectional view of the lighting system 400 shown in FIG. 4A, wherein the system is viewed from a horizontal direction 'Y' while cutting the system 400 by two faces in length 'Z' and height 'X' directions.

Referring to FIGS. 4A and 4B, the lighting system 400 may include: a body 410; a cover 430 coupled with the body 410; and an end-cap 450 located at both ends of the body 410.

An LED module 443 is coupled to the bottom face of the body 410, and the body 410 may be formed using a metallic material having excellent conductivity and heat dissipation effects, in order to discharge heat generated by an LED package 444 to the outside through the top face of the body 410, without being particularly limited thereto.

The LED package 444 may include an LED (not shown). The LED (not shown) may be provided with a desired slope angle relative to the bottom face of the cavity (not shown).

The LED (not shown) may dissipate light to lateral sides. The light dissipated to the lateral sides may be reflected to a wall side of the cavity or a lead frame (not shown) and output toward the top of the LED package 444. Since the LED has a desired slope angle relative to the bottom surface of the cavity (not shown), the LED package 444 and a lighting system 400 having the foregoing LED may exhibit enhanced light extraction efficacy and more considerably increase reliability of the lighting system 400.

The LED package 444 may be mounted on a substrate with multiple colors and/or multiple rows, resulting in a module. LED packages may also be mounted by the same interval or, if necessary, by different distances, to thereby control brightness. The PCB used as the substrate 442 may be a metal core PCB (MCPCB) or made of FR4.

The cover 430 may take the shape of a circle to surround the bottom of the body 410, without being limited thereto.

The cover 430 protects the LED module 343 from foreign substances. In addition, the cover 430 prevents glare of light emitted by the LED package 344 and includes diffusion particles to uniformly discharge light to the outside. In addition, a prism pattern or the like may be formed on at least one of the inner and outer surfaces of the cover 430. Alternatively, a phosphor may be applied onto at least one of the inner and outer surfaces of the cover 430.

Meanwhile, the cover 430 should exhibit superior light transmittance to discharge light emitted by the LED package 344 through the cover 430 to the outside, and the cover 430 should exhibit sufficient heat resistance to endure heat generated from by the LED package 344. Preferably, the cover 430 is composed of a material including polyethylene terephthalate (PET), polycarbonate (PC) or polymethyl methacrylate (PMMA) and the like.

The end cap 450 is arranged on both ends of the body 410 and may be used to seal a power device (not shown). In addition, the end cap 450 is provided with a power pin 452, allowing the lighting system 400 according to the embodiment to be applied to a terminal from which a conventional fluorescent light has been removed, without using any additional device.

Figure 5:
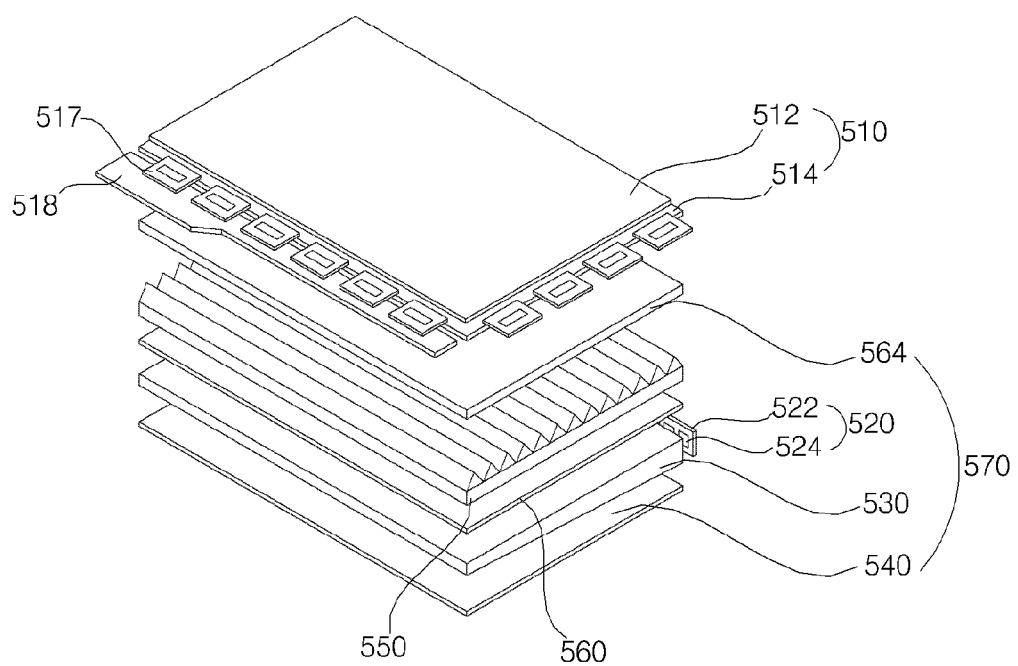
FIG. 5 is a schematic view illustrating a backlight unit including an LED package according to an embodiment.

FIG. 5 is an exploded perspective view illustrating a liquid crystal display device including an LED according to an embodiment.

FIG. 5 illustrates an edge-light type liquid crystal display device 500 which includes a liquid crystal display panel 510 and a backlight unit 570 to supply light to the liquid crystal display panel 510.

The liquid crystal display panel 510 displays an image using light supplied from the backlight unit 570. The liquid crystal display panel 510 includes a color filter substrate 512 and a thin film transistor substrate 514 which face each other through liquid crystal interposed therebetween.

The color filter substrate 512 can render color images to be displayed through the liquid crystal display panel 510.

The thin film transistor substrate 514 is electrically connected to a printed circuit board 518 on which a plurality of circuit components is mounted through a driving film 517. The thin film transistor substrate 514 responds to drive signals supplied from the printed circuit board 518 and may apply drive voltage from the printed circuit board 518 to liquid crystals.

The thin film transistor substrate 514 includes a thin film transistor and a pixel electrode formed as a thin film on other substrates composed of a transparent material such as glass or plastic.

The backlight unit 570 includes; a light-emitting device module 520 to emit light, a light guide plate 530 to convert light emitted by the light-emitting device module 520 into surface light and supply the light to the liquid crystal display panel 510, a plurality of films 550, 560 and 564 to uniformize brightness distribution of light emitted by the light guide plate 530 and improve vertical incidence, and a reflective sheet 540 to reflect light emitted to the back of the light guide plate 530 to the light guide plate 530.

The LED module 520 may include a plurality of LED packages 524 and a PCB substrate 522 on which the plural LED packages are mounted to form a module.

Each LED package 524 may include an LED (not shown). The LED may be provided to have a slope angle relative to the bottom face of a cavity (not shown). The LED (not shown) may dissipate light to a lateral side of the cavity. The dissipated light may be reflected to a wall side of the cavity (not shown) or a lead frame (not shown), thus being output toward the top of the LED package 524. Using the LED package 524 having the LED (not shown) with a desired slope may increase light extraction efficacy of the backlight unit 570, thereby enhancing reliability of the backlight unit 570.

Meanwhile, the backlight unit 570 includes a diffusion film 566 to diffuse light projected from a light guide plate 530 toward the liquid crystal display panel 510, a prism film 550 to concentrate the diffused light and thus improve vertical incidence, and a protective film 564 to protect the prism film 550.

Figure 6:
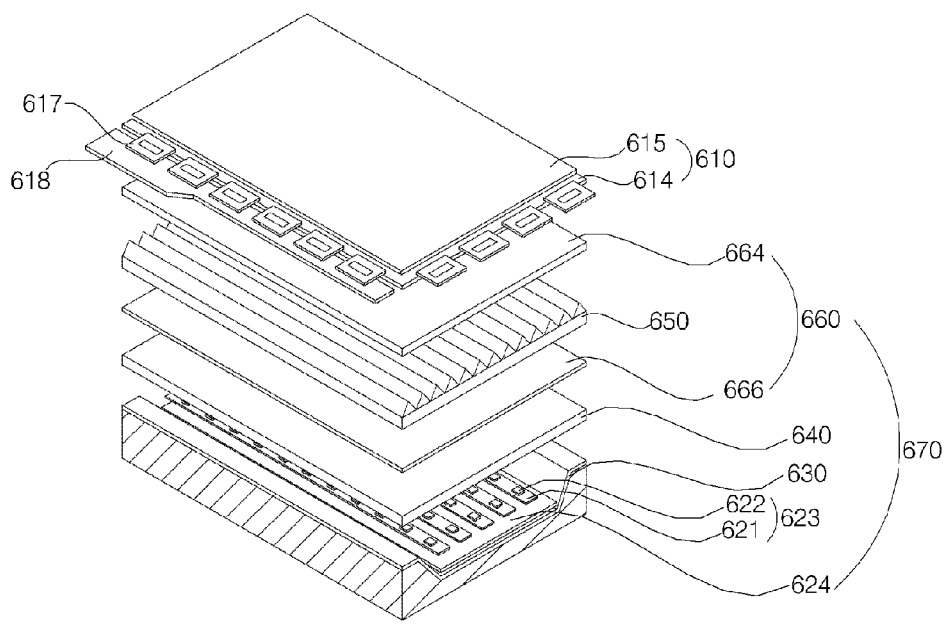
FIG. 6 is a schematic view illustrating a backlight unit including an LED package according to an embodiment.

FIG. 6 is an exploded perspective view illustrating a liquid crystal display including the LED according to an embodiment. However, the contents illustrated and described in FIG. 5 are not mentioned in detail.

FIG. 6 illustrates a direct-lit type liquid crystal display device 600 which comprises a liquid crystal display panel 610 and a backlight unit 670 to supply light to the liquid crystal display panel 610. The liquid crystal display panel 610 is substantially identical to that described in FIG. 5, therefore, a detailed description thereof will be omitted.

The backlight unit 670 may include a plurality of LED modules 623, a reflective sheet 624, a bottom chassis 630 to receive the reflective sheet 624 as well as the plural LED modules 623, a diffusion plate 640 positioned on top of the LED modules 623, and a plurality of optical films 660.

Each LED module 623 may include a plurality of LED packages 622 and a PCB substrate 621 on which the plural LED packages 622 are mounted to form a module.

Each LED package 622 may include an LED (not shown). The LED may be provided to have a slope angle relative to the bottom face of a cavity (not shown). The LED (not shown) may dissipate light to a lateral side of the cavity. The dissipated light may be reflected to a wall side of the cavity (not shown) or a lead frame (not shown), thus being output toward the top of the LED package 622. Using the LED package 622 having the LED (not shown) with a desired slope may increase light extraction efficacy of the backlight unit 670, thereby enhancing reliability of the backlight unit 670.

The reflective sheet 624 reflects light emitted from the LED package 622 toward the liquid crystal display panel 610, so as to improve luminous efficacy.

Meanwhile, light emitted from the light-emitting device module 623 is projected onto the diffusion plate 640 and an optical film 660 is arranged on top of the diffusion plate 640. The optical film 660 includes a diffusion film 666, a prism film 650 and a protective film 664.

As is apparent from the foregoing, the LED package according to the foregoing embodiment may include an LED provided with a slope angle relative to a cavity, so as to utilize incident light through a lateral side of the LED.

Also, the LED package according to the embodiment may include two LEDs to enhance light output.

The LED package according to an embodiment may have an LED provided on an side face of the cavity to increase side light emission of the LED through a lateral side of the LED.

The LED package according to an embodiment may increase an orientation angle through reflection of side light emitted from the LED.

The LED package according to an embodiment may include a filler interposed between the LED and the body of the package to prevent interface debonding.

The LEDs according embodiments of the present invention is not limited to configurations and processes illustrated in the fore-mentioned embodiments. Further, those skilled in the art will appreciate that a variety of combinations and modifications of partially or entirely selected parts of respective embodiments are possible.

Although the embodiments of the present invention have been disclosed for illustrative purposes, those skilled in the art will appreciate that various modifications, additions and substitutions are possible, without departing from the scope and spirit of the invention as disclosed in the accompanying claims. For example, the respective elements described in detail in the embodiments may be modified. Further, it will be understood that differences relating to these modifications, additions and substitutions are covered by the scope of the invention defined in the accompanying claims.

What is claimed is:

1. A light-emitting device (LED) package, comprising:
a body including a cavity; a lead frame disposed in the cavity; a light-emitting device electrically connected to the lead frame, the LED being inclined at a prescribed angle relative to a bottom surface of the cavity and including a light emitting part and a non-light emitting part, a recess is provided in a region of the cavity to be connected to at least a region of the non-light emitting part; and a filler disposed in a gap between the recess and the light-emitting device,
wherein the recess is disposed on a side surface of the cavity.

2. The LED package according to claim 1, wherein the recess is disposed on each of opposite side surfaces of the cavity.

3. The LED package according to claim 1, wherein the lead frame is extended and linked to the recess to be disposed on the side surface of the cavity.

4. The LED package according to claim 1, wherein the LED are two LEDs and the two LEDs face each other.

5. The LED package according to claim 4, wherein the two LEDs are disposed on two opposite side surfaces of the cavity, respectively.

6. The LED package according to claim 4, wherein the two LEDs have the same slope angle relative to the bottom surface of the cavity.

7. The LED package according to claim 1, wherein the recess has a slope angle relative to the bottom surface of the cavity.

8. The LED package according to claim 1, wherein the light emitting part emits light and the non-light emitting part supports the light emitting part.

9. The LED package according to claim 1, further comprising a wavelength conversion layer arranged to surround the LED.

10. A lighting system comprising the LED package according to claim 1.

11. The lighting system according to claim 10, wherein the recess is disposed on each of opposite side surfaces of the cavity.

12. The lighting system according to claim 10, wherein the lead frame is extended and linked to the recess to be disposed on the side surface of the cavity.

13. The lighting system according to claim 10, wherein the LED are two LEDs and the two LEDs face each other.

14. The lighting system according to claim 13, wherein the two LEDs are disposed on two opposite side surfaces of the cavity, respectively.

* * * * *